United States Patent
Sugimoto

(10) Patent No.: US 7,119,933 B2
(45) Date of Patent: Oct. 10, 2006

(54) IMAGE READING APPARATUS

(75) Inventor: Satoshi Sugimoto, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 871 days.

(21) Appl. No.: 10/194,280

(22) Filed: Jul. 15, 2002

(65) Prior Publication Data
US 2003/0021496 A1 Jan. 30, 2003

(30) Foreign Application Priority Data

Jul. 24, 2001 (JP) ............................. 2001-223069
May 23, 2002 (JP) ............................. 2002-148990

(51) Int. Cl.
H04N 1/04 (2006.01)
H04N 1/00 (2006.01)
G03G 15/30 (2006.01)
H01L 27/00 (2006.01)
G06K 7/10 (2006.01)

(52) U.S. Cl. ...................... 358/474; 358/497; 358/494; 358/471; 358/487; 358/400; 358/468; 358/501; 399/211; 399/212; 250/208.1; 235/454

(58) Field of Classification Search ................ 358/474, 358/497, 494, 471, 487, 400, 468, 501; 399/211, 399/212; 250/208.1; 235/454
See application file for complete search history.

(56) References Cited

U.S. PATENT DOCUMENTS 6,710,898 B1 * 3/2004 Chang ......................... 358/474
6,903,849 B1 * 6/2005 Yokota ........................ 358/497
6,975,436 B1 * 12/2005 Saito .......................... 358/497

FOREIGN PATENT DOCUMENTS

JP       11-187223       7/1999

* cited by examiner

Primary Examiner—Jerome Grant, II
Assistant Examiner—Houshang Safaipour
(74) Attorney, Agent, or Firm—Fitzpatrick, Cella, Harper & Scinto

(57) ABSTRACT

An image reading apparatus includes a movable image-capturing printed circuit board including an image device, and a controlling printed circuit board which is fixed to the image reading apparatus and which controls the driving of the image device. Both printed circuit boards include connectors. When electric connection is established between the connectors, signal transmission and reception is performed. The connectors are connected only in a predetermined position. This can eliminate the need for using cable wires. Thus, a simplified structure can reduce emission generated by using cable wires to transmit a driving signal for the image device and a read image signal.

12 Claims, 13 Drawing Sheets

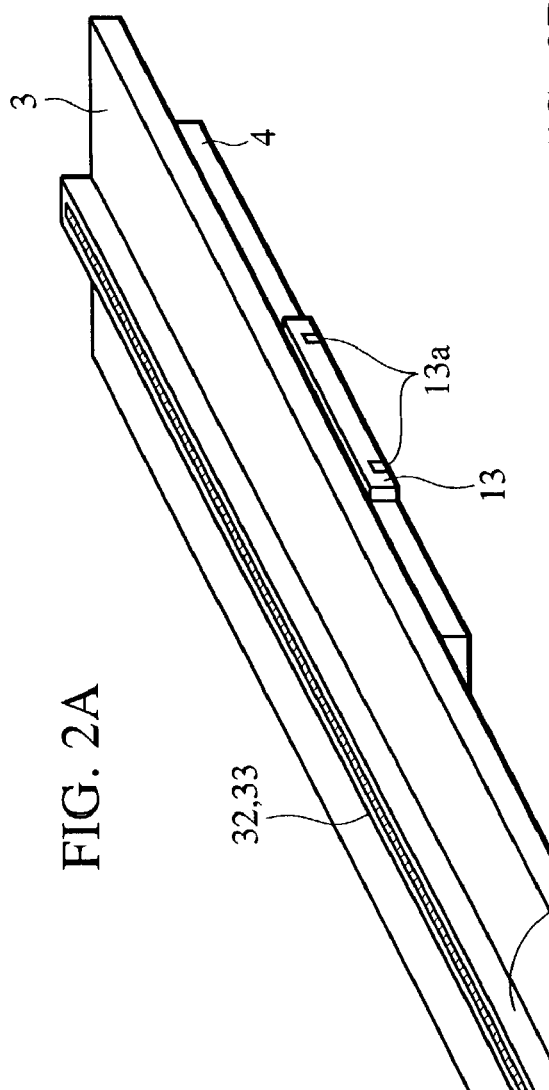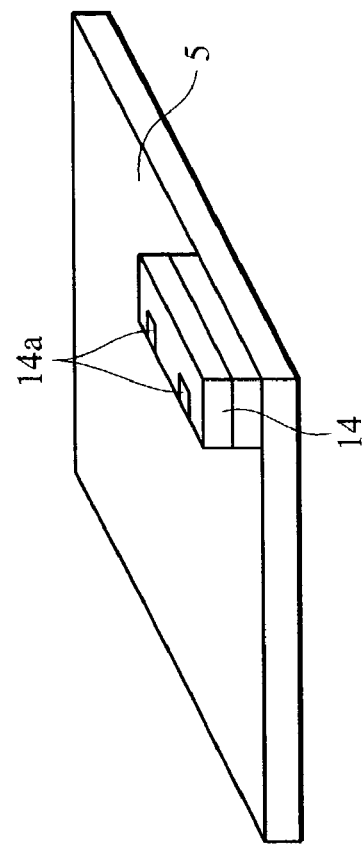

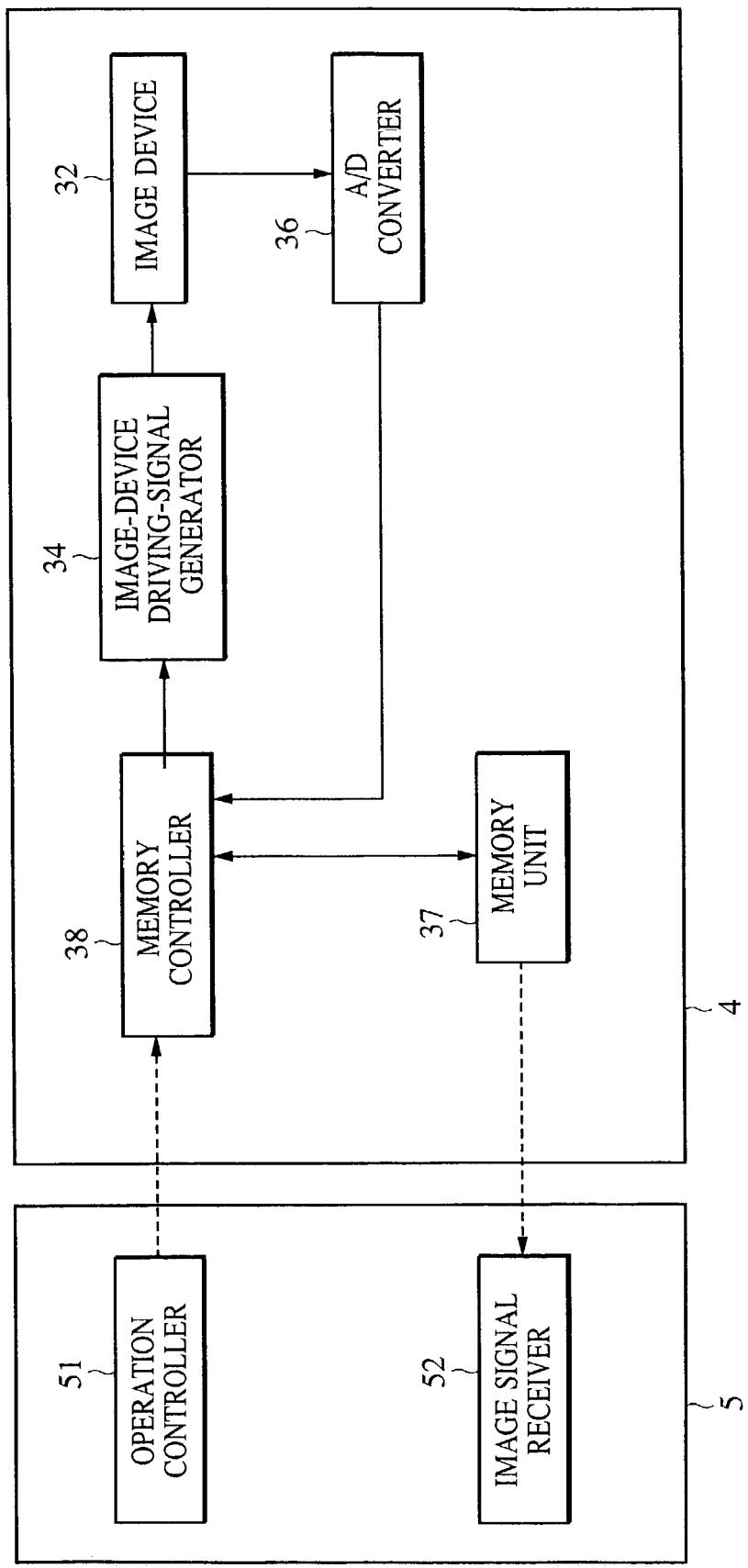

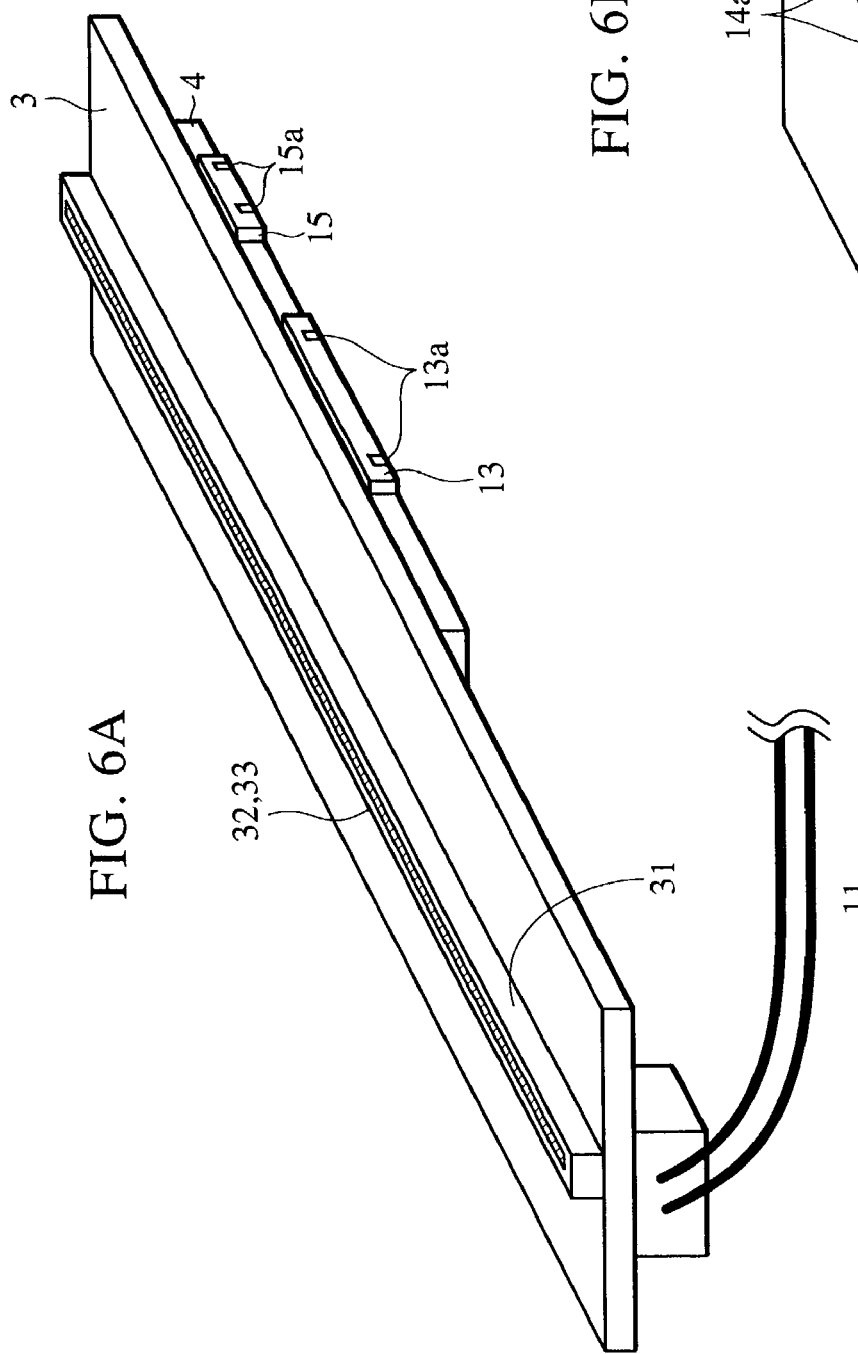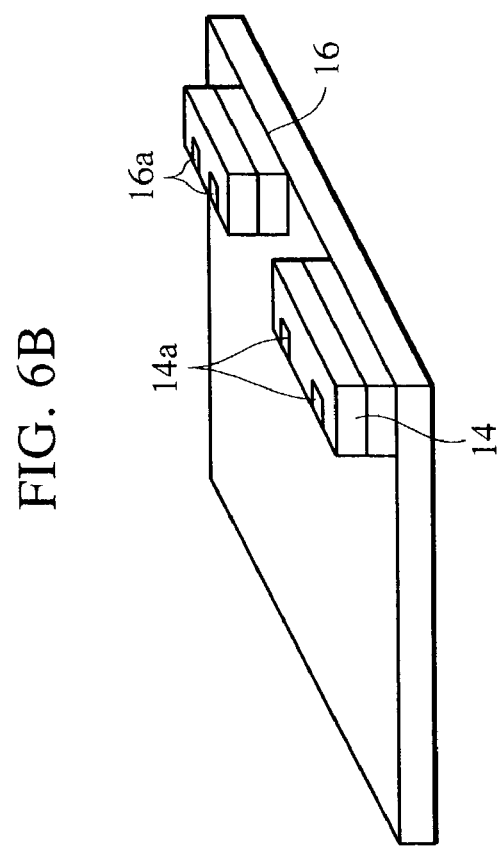

IMAGE READING APPARATUS

BACKGROUND OF THE INVENTION

1. Field of the Invention

The present invention relates to an image reading apparatus that uses an image device to read an original document.

2. Description of the Related Art

Conventionally, for image reading by copying machines, scanners, etc., image reading apparatuses using light-emitting devices and image devices have been used. An image reading apparatus of the related art is described below with reference to FIGS. 13 and 14.

FIG. 13 is a perspective view of an image reading apparatus 1 of the related art, and FIG. 14 is a detailed view of the main part of the image reading apparatus 1. The image reading apparatus 1 has, on its top, a contact glass 2 on which an original document is set. The image reading apparatus 1 includes a frame member 3 that slides when the original document is read. The frame member 3 has an image capturing unit 31 on its top. The image capturing unit 31 includes, in its longitudinal direction, an image device 32 made of a contact image sensor (CIS) or a charge-coupled device (CCD), and a light-emitting device 33 which is made of a halogen lamp and which is integrated with the image device 32. The frame member 3 has, on its bottom, an image-capturing printed circuit board 4 for driving the image capturing unit 31. The image capturing unit 31 is electrically connected to the image-capturing printed circuit board 4, and is driven by a signal from the image-capturing printed circuit board 4. The frame member 3 is supported by supporters 9a and 9b so as to slide along the supporters 9a and 9b, and is slid by a motor (not shown). A controlling printed circuit board 5 is fixed to a bottom portion of the image reading apparatus 1, and controls the sliding operation of the frame member 3, and the image reading operation and light-emitting operation of the image capturing unit 31. The image-capturing printed circuit board 4 and the controlling printed circuit board 5 are connected to each other by a cable wire 10. Image signals based on the original document read by the image capturing unit 31, and control signals for the image reading operation and the light emitting operation are transmitted and received via the cable wire 10, as needed.

The image-capturing printed circuit board 4 has a connector 21 at an end thereof, and the controlling printed circuit board 5 has a connector 22 at an end thereof. The ends of the cable wire 10 are connected to the connectors 21 and 22. The cable wire 10 is flexible and can be transformed and moved following the sliding operation of the frame member 3.

In addition to the cable wire 10, a power-supply cable wire 11 is connected to the image-capturing printed circuit board 4. The power-supply cable wire 11 is used to supply power for the sliding operation of the frame member 3 and for the image reading operation and the light emitting operation of the image capturing unit 31. The power-supply cable wire 11 is connected to a power-supply board (not shown). The power-supply cable wire 11 is flexible similarly to the cable wire 10 and can be transformed and moved following the sliding operation of the frame member 3.

Driving signals that drive the light-emitting device 33 and the image capturing unit 31 for image reading require a large amount of current in order to perform photoelectric conversion. Also, to realize high speed reading, a high frequency signal is used. Accordingly, whenever an image is read, transmission and reception of signals having high frequency and large current is repeatedly performed between each of the image device 32 and the light-emitting device 33, and an integrated circuit for driving both. Thus, emission is generated, which is a big problem.

Through the power-supply cable wire 11, signals for driving the image device 32 and the light-emitting device 33 are transmitted as so-called "common mode currents", using a power-supply pattern and a ground pattern on the printed circuit board 4 as paths. This is a similar big problem of emission.

Regarding preventive measures for the emission from the cable wire 10 and the power-supply cable wire 11, methods are conventionally known which prevent the generated emission by incorporating a ferrite core and by accommodating in a shielded box housing the whole cable wire and, if necessary, a printed circuit board.

Nevertheless, in recent years, the amount of emission has been increasing due to the higher frequencies of driving signals and image-information signals which are set for meeting the demand of high speed image processing. Accordingly, a plurality of frequency bands have a large amount of emission, so that it is difficult to prevent the emission by using filter components such as ferrite cores. In addition, the ferrite cores are expensive, and the number of usable ferrite cores is limited.

Also, with an increased number of driving signals and an enlarged circuit size, there are many cases in which the area of a printed circuit board itself must be increased. Accordingly, to use a shielded box to shield the emission, its size is an issue. When the shielded box is further enlarged, there is a possibility that emission caused by cavity resonance depending on the box size may be generated in a frequency range of 30 MHz to 1 GHz in which some measures should be taken. In frequencies generated due to the cavity resonance, currents having corresponding frequency components are repeatedly reflected by a shield conductor and are mutually superimposed, whereby the currents exhibit distributions that are not stationary canceled. As a result, the effect of the shield is damaged, thus causing a high intensity of emission. The frequency generated by the cavity resonance is dependent on the size of a shield. Thus, to suppress the cavity resonance, by forming a partition structure in the box so that the box size is virtually reduced, the generated emission frequency can be excluded from frequencies observed for emission measurement. In this way, it is possible to change the generated emission frequency to a high frequency, but the shield structure is complex and assembly cost increases.

According to Japanese Patent Laid-Open No. 11-187223, when the disclosure is described by using the above reference numerals, the driving signals are generated by the image-capturing printed circuit board 4 connected to the image capturing unit 31, and by using a trigger signal, the image-capturing printed circuit board 4 and the controlling printed circuit board 5 are synchronized with each other. This makes it possible to limit signals output from the controlling printed circuit board 5 to the image-capturing printed circuit board 4 to only the trigger signal. Thus, the number of signal lines in the cable wire 10 can be reduced and the emission can be suppressed.

Nevertheless, since the cable wire 10 must be provided with a ground wire, a high frequency current is transmitted by the ground line of the cable wire 10, so that a similar problem of emission occurs. Also, since a read image must be set to have a higher resolution in order to realize high-resolution image processing, the number of signal lines constituting the cable wire 10 tends to increase with an increase in the number of image signals. Accordingly, there is a limitation in reducing the number of signal lines in the cable wire 10. For a high frequency current causing the emission, transmission paths increase, and it becomes difficult to take preventive measures for the emission.

SUMMARY OF THE INVENTION

It is an object of the present invention to take preventive measures without using expensive filter components such as ferrite cores, even if an image-information signal has a high frequency causing an increase in emission.

It is another object of the present invention to take, not preventive measures having a limitation in the size of a printed circuit board, such as a technique using a shielded box, but preventive measures that can easily cope with even a case in which a printed circuit board has a large size.

It is another object of the present invention to take preventive measures for preventing emission from being generated due to a high frequency current transmitted through a ground line of a cable wire.

It is a further object of the present invention to easily take preventive measures for preventing emission, even if the number of image signals is increased by high-resolution image processing.

To achieve the above objects, according to an aspect of the present invention, an image reading apparatus for reading an original document set in position is provided. The image reading apparatus includes an image-capturing printed circuit board with which an image device is integrated, and which is movable, drives the image device, and includes a first connector, and a controlling printed circuit board which is disposed in a fixed position, and which controls the operation of the image device and includes a second connector. The first connector and the second connector are electrically connected to each other only in a predetermined position so that signal transmission and reception is performed between the first connector and the second connector.

Preferably, the image-capturing printed circuit board includes at least the image device, a driving-signal generating circuit for driving the image device, a converting circuit for converting an electric signal corresponding to image information read by the image device into a digital signal, and a memory unit for storing the digital signal and a driving signal for the image device.

The image-capturing printed circuit board may include a memory controller for controlling the data stored in the memory unit.

A light-emitting device may be integrated with the image-capturing printed circuit board, and the controlling printed circuit board may also control the operation of the light-emitting device.

The image-capturing printed circuit board may include at least the image device, an image-device driving-signal generating circuit for driving the image device, a converting circuit for converting image information read by the image device into a digital signal, a light-emitting device, a light-emitting-device driving-signal generating circuit for driving the light-emitting device, and a memory unit for storing a driving signal for the image device, a driving signal for the light-emitting device, and the digital signal.

The image-capturing printed circuit board may include a memory controller for controlling the data stored in the memory unit.

The image-capturing printed circuit board may include at least one battery unit including a battery connector, the controlling printed circuit board may include at least one charging unit including a charging connector, and electric power may be supplied from the charging unit to the battery unit when the capacitor connecter and the charging connector are electrically connected to each other in the predetermined position.

The image-capturing printed circuit board may include at least the image device, a driving-signal generating circuit for driving the image device, a converting circuit for converting an electric signal corresponding to image information read by the image device into a digital signal, a memory unit for storing the digital signal and a driving signal for the image device, a battery unit for storing electric power, and a voltage stabilizing circuit for converting the stored power into a constant voltage.

The predetermined position may be an initial position in which the image-capturing printed circuit board is positioned on standby.

According to another aspect of the present invention, an image reading apparatus for reading an original document set in position is provided. The image reading apparatus includes an image-capturing printed circuit board with which an image device is integrated, and which is movable, drives the image device, and includes a first connector, and a controlling printed circuit board which controls the operation of the image device, and which includes a second connector. The first connector and the second connector are antenna portions which perform signal transmission and reception when being in proximity to each other so as to have a predetermined distance therebetween.

Preferably, the antenna portions are formed by the wiring patterns of both printed circuit boards.

According to the present invention, by providing an image-capturing printed circuit board with a memory unit, and only in a specified position, by performing transmission and reception of electric signals with a controlling printed circuit board, conventionally used cable wires can be eliminated. Thus, it is possible to suppress emission caused by an image-signal driving signal and a read image signal.

Also, by forming antenna portions in the signal-transmitting/receiving parts of an image-capturing printed circuit board and a controlling printed circuit board, and using electromagnetic waves to perform transmission and reception of signals, deterioration in a contact portion which is caused by mechanical contact can be avoided.

Further objects, features and advantages of the present invention will become apparent from the following description of the preferred embodiments with reference to the attached drawings.

BRIEF DESCRIPTION OF THE DRAWINGS

FIGS. 2A and 2B are perspective illustrations of the main part of the image reading apparatus according to the first embodiment of the present invention.

FIG. 5 is a block diagram showing a modification of the first embodiment of the present invention.

FIGS. 6A and 6B are perspective illustrations of an image reading apparatus according to a second embodiment of the present invention.

DESCRIPTION OF THE PREFERRED EMBODIMENTS

First Embodiment

Next, embodiments of the present invention are described below with reference to the accompanying drawings.

Figure 1:
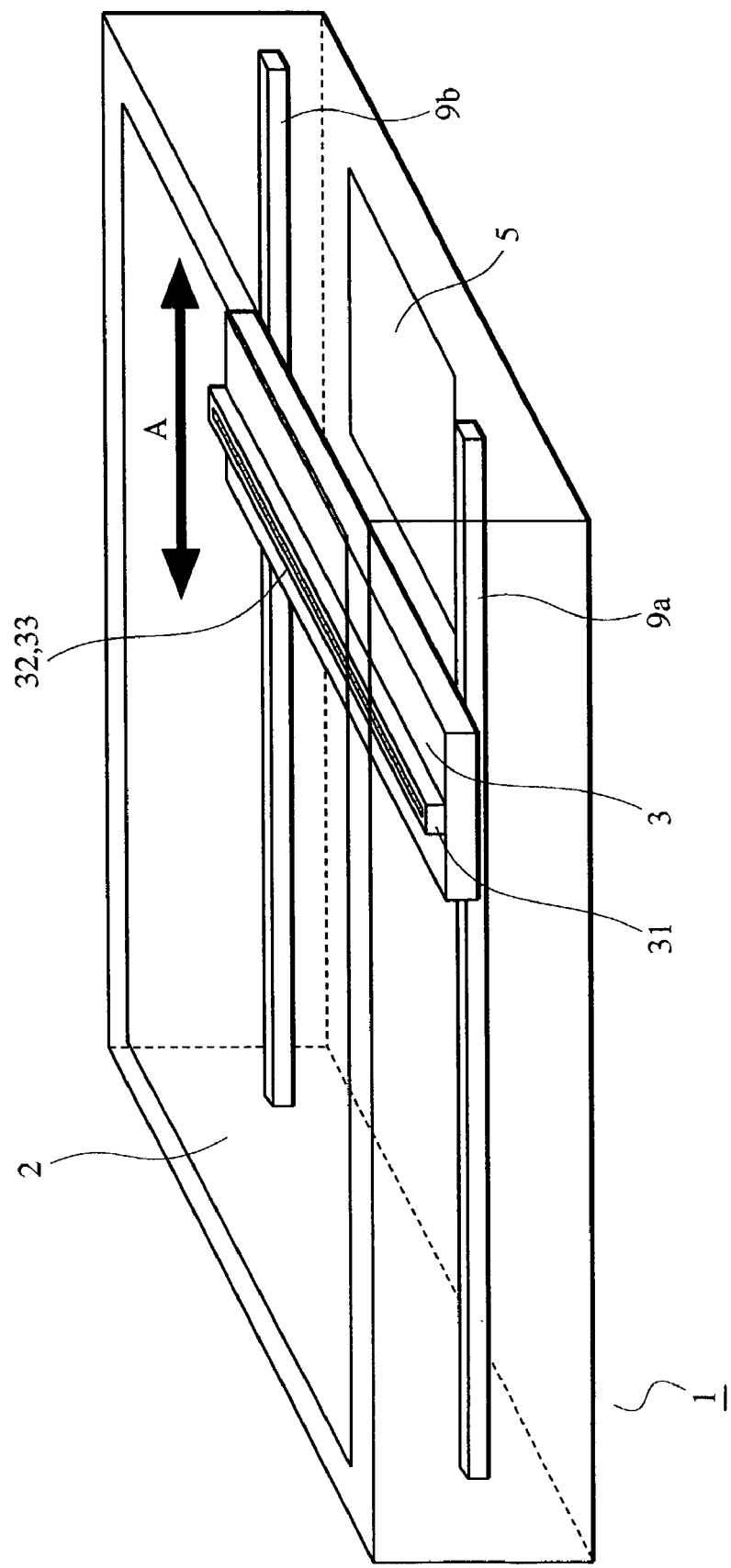
FIG. 1 is a perspective view showing an image reading apparatus according to a first embodiment of the present invention.
Figure 13:
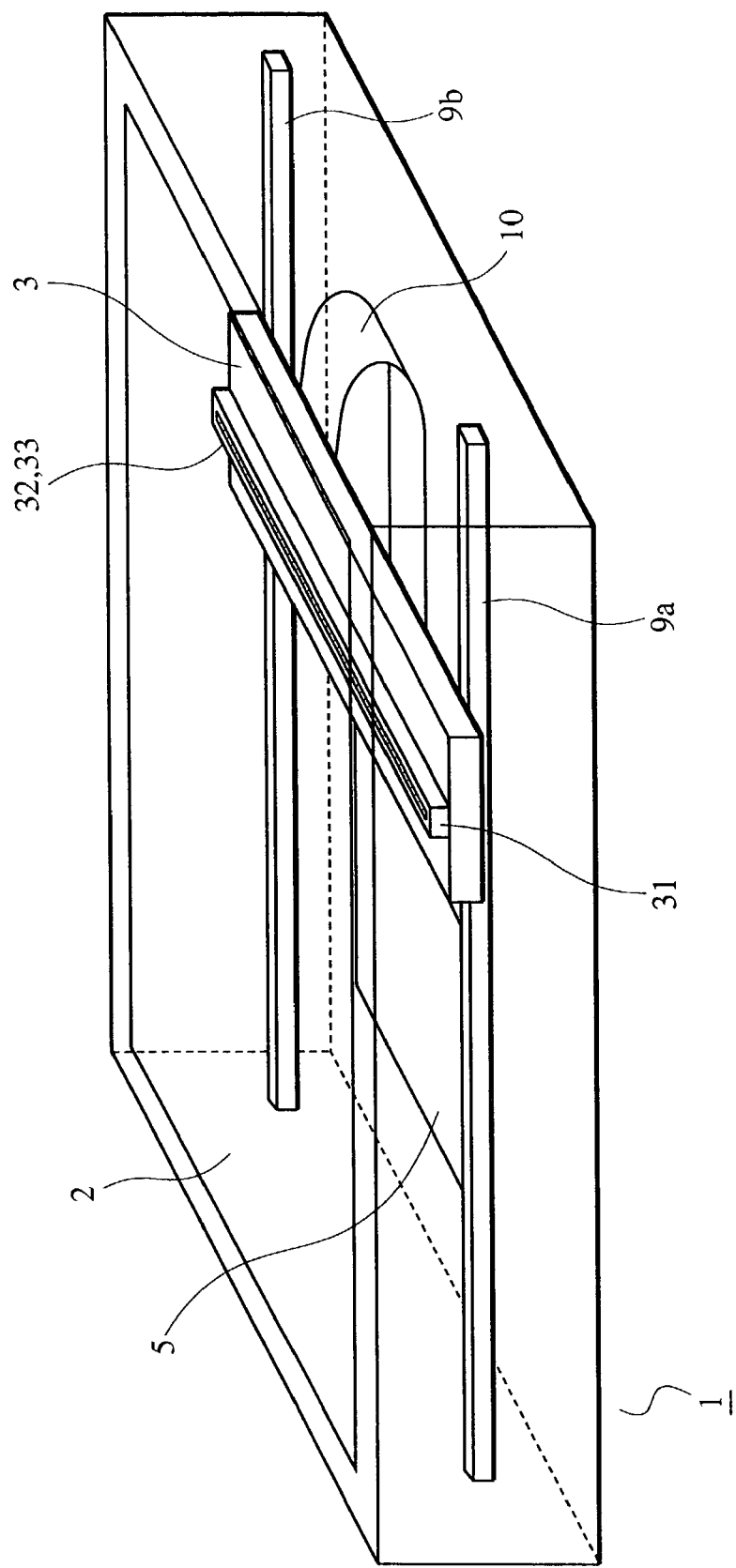
FIG. 13 is a perspective view showing an image reading apparatus of the related art.
Figure 14:
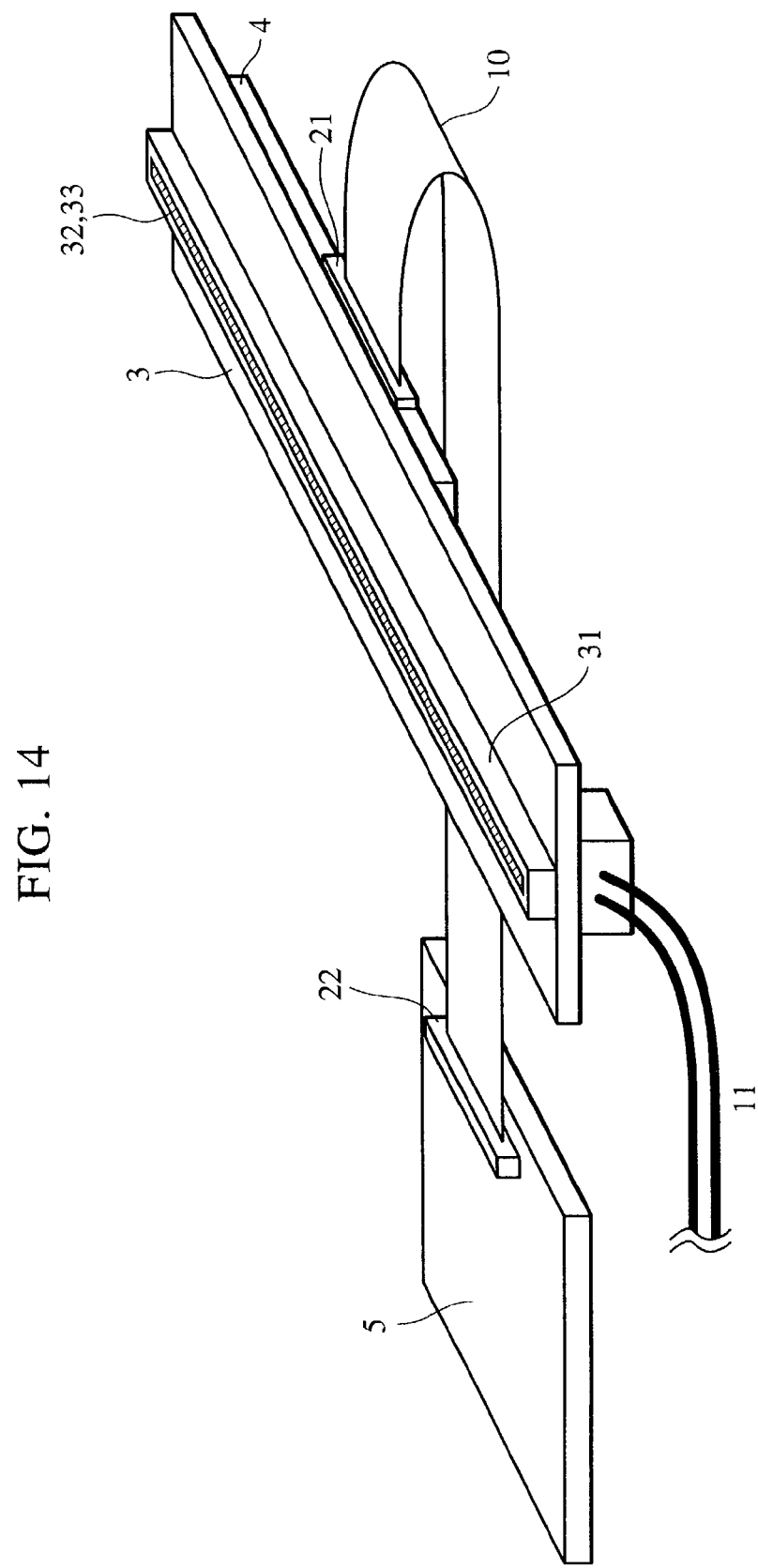
FIG. 14 is a perspective view showing the main part of the image reading apparatus of the related art.

FIG. 1 and FIGS. 2A and 2B show a first embodiment of the present invention. Members identical to those shown in FIGS. 13 and 14 are denoted by identical reference numerals.

FIG. 1 is a perspective view showing an image reading apparatus 1 (using an image sensor or the like) according to the first embodiment of the present invention, and FIGS. 2A and 2B are detailed illustrations of the main part of the image reading apparatus shown in FIG. 1. The image reading apparatus 1 has, on its top, a contact glass 2 on which an original document is set. The image reading apparatus 1 includes a frame member 3 that slides along the directions of the arrows A when the original document is read. The frame member 3 has an image capturing unit 31 on its top. The image capturing unit 31 includes, in its longitudinal direction, an image capturing device 31 made of a contact image sensor (CIS) or a charge-coupled device (CCD), and a light-emitting device 33 which is made of a halogen lamp and which is integrated with the image device 32. The frame member 3 has, on its bottom, an image-capturing printed circuit board 4 for driving the image capturing unit 31. The image capturing unit 31 is electrically connected to the image-capturing printed circuit board 4, and is driven by a signal from the image-capturing printed circuit board 4. The frame member 3 is supported by supporters 9a and 9b so as to slide along the supporters 9a and 9b, and is slid along the directions of the arrows A by a stepping motor (not shown). A controlling printed circuit board 5 is fixed to a bottom portion of the image reading apparatus 1, and controls the sliding operation of the frame member 3, the image reading operation of the image device 32, and the light emitting operation of the light-emitting device 33.

The image-capturing printed circuit board 4 has a connector 13 at an end thereof, and the control printed circuit board has a connector 14 at an end thereof. The connector 13 is provided with an electrode portion 13a, and the connector 14 is provided with an electrode portion 14a. Both connectors 13a and 14a can be electrically connected to each other in the initial position of the frame member 3. The initial position is a position in which the image capturing unit 31 stands by before performing image capturing, and may be any position within a range in which the frame member 3 slides along the supporters 9a and 9b. However, for an efficient operation of reading the original document, it is preferable that one of two sides of the range in the frame member 3 slides be set as the initial position. In the first embodiment, as FIG. 1 shows, the right side is set as the initial position.

In addition to the cable wire 10, a power-supply cable wire 11 is connected to the image-capturing printed circuit board 4. The power-supply cable wire 11 is used to supply power for the sliding operation of the frame member 3 and for the image reading operation and the light emitting operation of the image capturing unit 31. The power-supply cable wire 11 is connected to a power-supply board (not shown). The power-supply cable wire 11 is flexible similarly to the cable wire 10 and can be transformed and moved following the sliding operation of the frame member 3.

Figure 3:
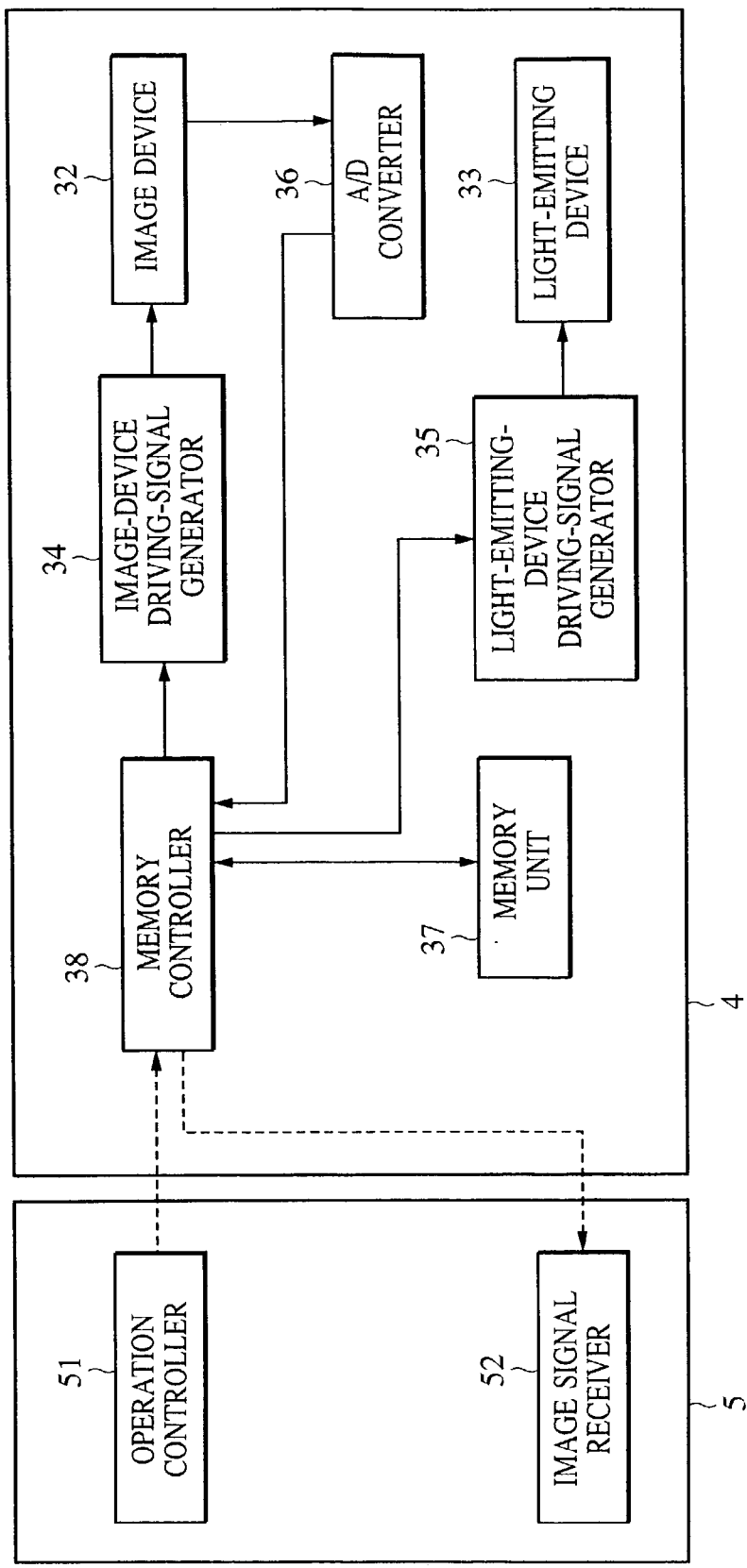
FIG. 3 is a block diagram showing the first embodiment of the present invention.

Next, FIG. 3 is a block diagram showing electric connection between the image-capturing printed circuit board 4 and the controlling printed circuit board 5. The image-capturing printed circuit board 4 has thereon the image device 32, the light-emitting device 33, an image-device driving-signal generator 34, a light-emitting-device driving-signal generator 35, an analog-to-digital (A/D) converter 36, a memory unit 37, and a memory controller 38.

The image device 32 reads the original document set on the contact glass 2. The light-emitting device 33 emits light onto the original document. The image-device driving-signal generator 34 generates the driving signal required for driving the image device 32. The light-emitting-device driving-signal generator 35 generates the light-emitting-device driving signal required for the light-emitting device 33. The A/D converter 36 converts, into a digital signal, an analog image signal obtained such that the image device 32 reads the original document. The memory unit 37 temporarily stores control signals for the image-device driving-signal generator 34 and the light-emitting-device driving-signal generator 35, and the image signal digitized by the A/D converter 36. The memory controller 38 controls the image-device driving-signal generator 34 and the light-emitting-device driving-signal generator 35 by using the control signals stored in the memory unit 37. Also, the memory controller 38 receives a control signal from the controlling printed circuit board 5, and transmits, to the controlling printed circuit board 5, the image signal stored in the memory unit 37.

In addition, the controlling printed circuit board 5 has thereon an operation controller 51 that transmits, to the memory controller 38, the control signals for the image-device driving-signal generator 34 and the light-emitting-device driving-signal generator 35, and an image signal receiver 52 that receives the image signal temporarily stored in the memory unit 36.

The controlling printed circuit board 5 also transmits the driving signal for the stepping motor (not shown) for sliding the frame member 3. The driving signal for the stepping motor, and the control signals transmitted to the memory controller 38 are mutually synchronized. Thus, the sliding operation of the frame member 3, the reading operation of the image device 32, and the light emitting operation of the light-emitting device 33 can be performed while the operations are synchronized with one another.

Next, the operation by the image reading apparatus 1 of reading the original document is described below.

Initially, the frame member 3 is positioned on standby, and is electrically connected to the controlling printed circuit board 5 by the electrode portions 13a and 14a of the connectors 13 and 14. When the original document is set on the contact glass 2, and a reading-start signal is input from an external apparatus such as a personal computer to the image reading apparatus 1, the control signals required for the reading operation are sent from the operation controller 51 of the controlling printed circuit board 5 to the memory controller 38 in the image-capturing printed circuit board 4 via the electrode portions 13a and 14a of the connectors 13 and 14. The sent control signals are temporarily stored in the memory unit 37.

Next, under control of the memory controller 38, the control signal temporarily stored in the memory unit 37, which relates to image capturing, is sent to the image-device driving-signal generator 34. From the image-device driving-signal generator 34, signals such as a charge-transfer clock signal for controlling original-document reading timing are sent to the image device 32.

In synchronization the above control signal, the control signal temporarily stored in the memory unit 37, which relates to light emission of the light-emitting device 33, is sent to the light-emitting-device driving-signal generator 35. From the light-emitting-device driving-signal generator 35, a clock signal for controlling timing that controls the light-emitting device 33 to emit light is sent to the light-emitting device 33.

In synchronization with the above control signals, a driving signal for controlling driving timing is also sent to the stepping motor (not shown) that slides the frame member 3.

By driving the stepping motor, the frame member 3 starts to slide along the supporters 9a and 9b at a predetermined speed. When the sliding of the frame member 3 starts, the connection between the connectors 13 and 14 is temporarily deleted, so that the image-capturing printed circuit board 4 and the controlling printed circuit board 5 are in disconnected condition. When the frame member 3 is being slid, the light-emitting device 33 emits light with timing which is sent from the light-emitting-device driving-signal generator 35. The image device 32 performs the original-document reading operation with timing which is sent from the image-device driving-signal generator 34.

In parallel to the original-document reading operation of the image device 32, the read image data is sent and sequentially converted into a digital image signal by the A/D converter 36. The digital image signal obtained by the conversion is temporarily stored in the memory unit 37. When the original-document reading operation of the image device 32 is completed, the light-emitting device 33 stops light emission, and the frame member 3 is returned to the initial position. In the initial position, the image-capturing printed circuit board 4 and the controlling printed circuit board 5 are electrically connected to each other again by the electrode portions 13a and 14a of the connectors 13 and 14. On completion of the connection between the connectors 13 and 14, the image signal temporarily stored in the memory unit 37 is transmitted to the image signal receiver 52 of the controlling printed circuit board 5 via the connectors 13 and 14 by the memory controller 38. The image signal is transmitted from the image signal receiver 52 to the external apparatus such as a personal computer, and the original-document reading operation ends, so that the frame member 3 is positioned on standby in the initial position again.

As described above, by using the image reading apparatus 1 according to the first embodiment, the driving signals required for the image capturing operation, and the digital image signal can be transmitted without using any cable. Thus, the generation of the emission can be greatly suppressed.

Figure 4:
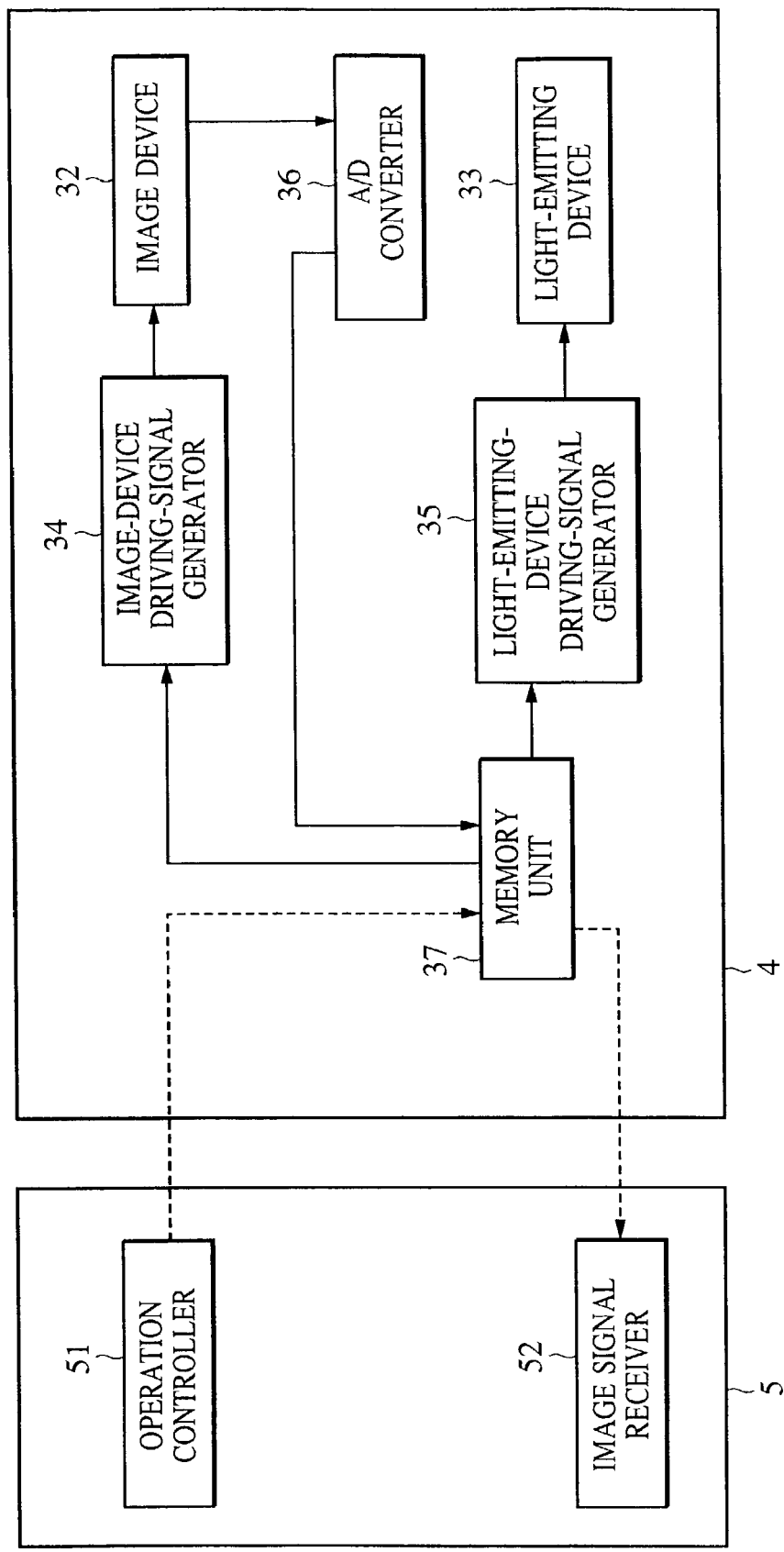
FIG. 4 is a block diagram showing a modification of the first embodiment of the present invention.

The memory controller 38 is not always required. It is also possible that the image reading apparatus 1 be controlled such that, in the initial position at the start of the original-document reading operation, the control signals for the image-device driving-signal generator 34 and the light-emitting-device driving-signal generator 35 are directly sent from the operation controller 51 to the memory unit 37, and in the initial position at the termination of the original-document reading operation, the image signal temporarily stored in the memory unit 37 is controlled to be sent from the operation controller 51 to the image signal receiver 52. In FIG. 4, a block diagram is shown which shows the electric connection between the image-capturing printed circuit board 4 and the controlling printed circuit board 5. FIG. 4 shows a form in which the memory controller 38 of the image-capturing printed circuit board 4 is omitted. Other components and their operations are identical to those in FIG. 3. Accordingly, a description of them is omitted. It is preferable to provide the memory controller 38 on the image-capturing printed circuit board 4 because transmission to and reception from the controlling printed circuit board 5 and transmission to and reception from the memory unit 37 can be separated and it is easy to cope with high speed processing.

Although the light-emitting device 33 made of a halogen lamp is integrated with the image device 32 to form the image capturing unit 31, and slides along the supporters 9a and 9b with the frame member 3, the first embodiment is not limited thereto, but the light-emitting device 33 may be fixed to the image reading apparatus 1 itself. In FIG. 5, a block diagram is shown which shows the electric connection between the image-capturing printed circuit board 4 and the controlling printed circuit board 5. FIG. 5 shows a form in which the light-emitting device 33 and the light-emitting-device driving-signal generator 35 of the image-capturing printed circuit board 4 in FIG. 3 are omitted. Other components and their operations are identical to those in FIG. 3. Accordingly, a description of them is omitted. In this case, if the light-emitting device 33 is synchronized with the control signal which relates to image capturing, it may be directly controlled by the controlling printed circuit board 5, or may be directly controlled by the external apparatus such as a personal computer. Nevertheless, it is preferable that the light-emitting device 33 slide with the image-capturing printed circuit board 4 because reflected light can be read and the need for using members such as reflecting mirrors can be eliminated.

Second Embodiment

FIGS. 6A and 6B are perspective illustrations of the main parts of an image reading apparatus according to a second embodiment of the present invention. Members identical to those (in the first embodiment) shown in FIGS. 2A and 2B are denoted by identical reference numerals.

As FIG. 6A shows, at an end of an image-capturing printed circuit board 4 provided on the bottom of a frame member 3, there are a connector 13 for transmitting and receiving electric signals such as control signals, and a battery-storage connector 15 for supplying power to a battery 15. As FIG. 6B shows, at an end of a controlling printed circuit board 5, there are a connector 14 for transmitting and receiving electric signals, and a battery-charging connector 16. The battery-storage connector 15 is provided with electrode portions 15a, and the battery-charging connector 16 is provided with electrode portions 16a. Similarly to electric connection between the connectors 13 and 14 in the initial position of the frame member 3, the battery-storage connector 15 and the battery-charging connector 16 can be also electrically connected to each other.

Figure 7:
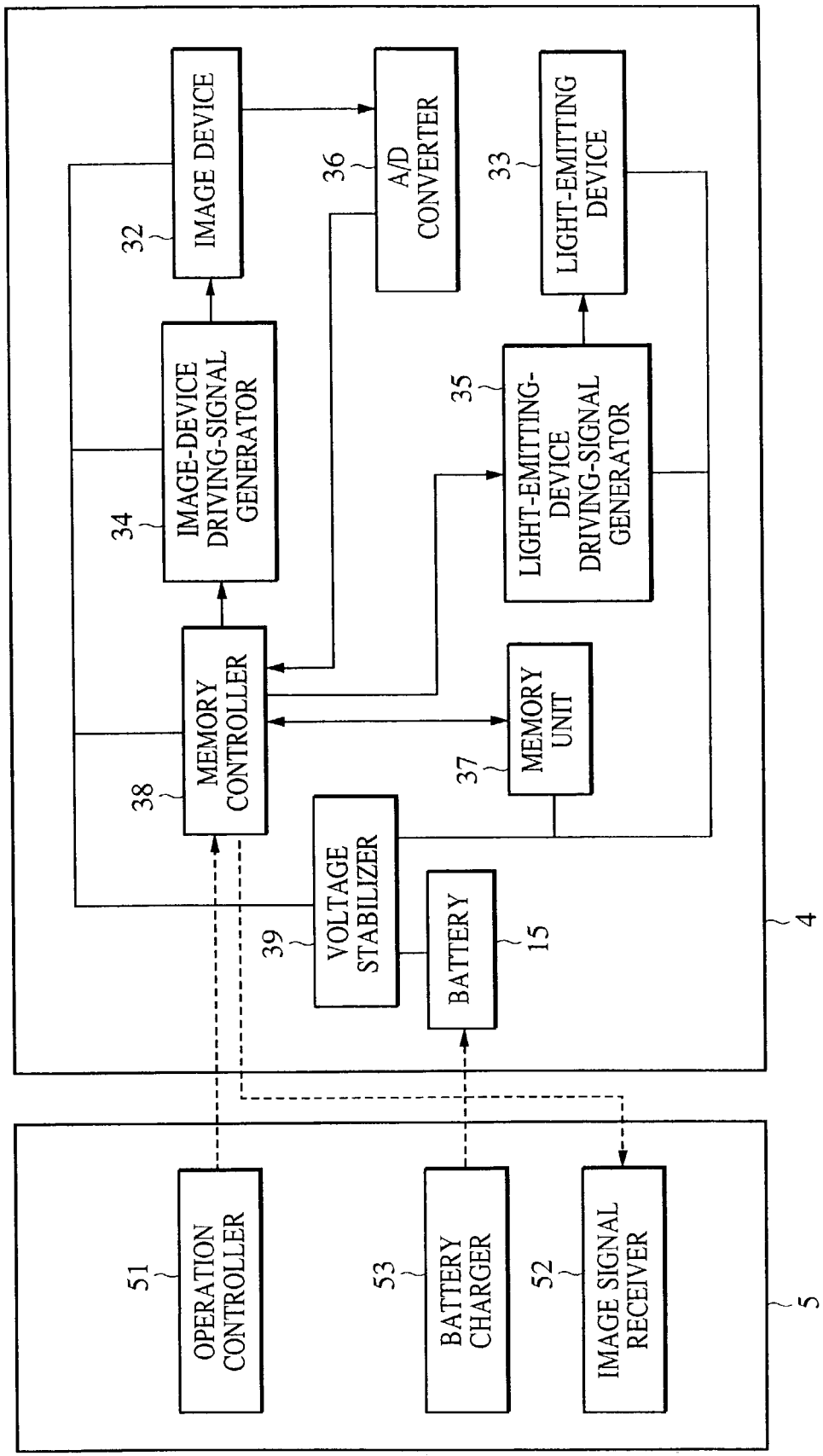
FIG. 7 is a block diagram showing the second embodiment of the present invention.

Next, FIG. 7 is a block diagram showing electric connection between the image-capturing printed circuit board 4 and the controlling printed circuit board 5. In FIG. 7, components identical to those (in the first embodiment) shown in FIG. 3 are denoted by identical reference numerals, and a description thereof is omitted.

In addition to the image device 32, the light-emitting device 33, the image-device driving-signal generator 34, the light-emitting-device driving-signal generator 35, the A/D converter 36, the memory unit 37, and the memory controller 38, which are shown in FIG. 3, the image-capturing printed circuit board 4 includes a battery 15 and a voltage stabilizer 39. The battery-charging connector 15 is used to perform charging using power supplied from a battery charger 53 via the battery-charging connector 16. The power required for the image-device driving-signal generator 34 and the light-emitting-device driving-signal generator 35 is adjusted to a constant voltage by the voltage stabilizer 39, and is supplied to the image-device driving-signal generator 34 and the light-emitting-device driving-signal generator 35.

In addition to the operation controller 51 and the image signal receiver 52 shown in FIG. 3, the controlling printed circuit board 5 also includes the battery-storage connector 15, and a battery charger 53 for supplying power by using the battery-charging connector 16.

Next, the original-document reading operation of the image reading apparatus according to the second embodiment is described below.

Initially, the frame member 3 is positioned on standby in the initial position, and is electrically connected to the controlling printed circuit board 5 by the electrode portions 13a and 14a of the connectors 13 and 14. At this time, the battery-storage connector 15 and the battery-charging connector 16 are also electrically connected by the electrode portions 15a and 16a, so that the battery 15 charges. When the original document is set on the contact glass 2, and a reading-start signal is input from an external apparatus such as a personal computer to the image reading apparatus, the control signals required for the reading operation is sent from the operation controller 51 of the controlling printed circuit board 5 to the memory controller 38 of the image-capturing printed circuit board 4 via the electrode portions 13a and 14a of the connectors 13 and 14. The control signals sent to the memory controller 38 are temporarily stored in the memory unit 37.

Next, under control of the memory controller 38, the control signal temporarily stored in the memory unit 37, which relates to image capturing, is sent to the image-device driving-signal generator 34, and a charge-transfer clock signal for controlling original-document-reading timing is sent from the image-device driving-signal generator 34 to the image device 32.

In synchronization with the above signal, under control of the memory controller 38, the control signal temporarily stored in the memory unit 37, which relates to light emission, is sent to the light-emitting-device driving-signal generator 35, and a clock signal for controlling timing for controlling the light-emitting device 33 to emit light is sent therefrom to the light-emitting device 33.

In synchronization with the above control signals, also a driving signal for controlling driving timing is transmitted to a stepping motor (not shown) for sliding the frame member 3.

By driving the stepping motor, the frame member 3 starts to slide along the guides 9a and 9b at a predetermined speed. When the frame member 3 starts to slide, the connection between the connectors 13 and 14, and the battery-storage connector 15 and the battery-charging connector 16 are temporarily deleted, so that the image-capturing printed circuit board 4 and the controlling printed circuit board 5 are not in conduction. Thus, subsequently, the power of the image-capturing printed circuit board 4 is supplied from the charged battery 15. While the frame member 3 is being slid, the light-emitting device 33 emits light with timing sent from the light-emitting-device driving-signal generator 35. The image device 32 performs the original-document reading operation with timing sent from the image-device driving-signal generator 34.

In parallel to the original-document reading operation by the image device 32, read image data is sent to the A/D converter 36, and is sequentially converted into a digital image signal. The digital signal is temporarily stored in the memory unit 37 under control of the memory controller 38.

When the original-document reading operation by the image device 32 is completed, the light-emitting device 33 stops emitting light, and the frame member 3 is returned to the initial position. In the initial position, the image-capturing printed circuit board 4 and the controlling printed circuit board 5 are electrically connected to each other by the electrode portions 13a and 14a of the connectors 13 and 14. When the connection between the connectors 13 and 14 is completed, the memory controller 38 controls the image signal temporarily stored in the memory unit 37 to be transmitted to the image signal receiver 52 of the controlling printed circuit board 5 via the connectors 13 and 14. The image signal is transmitted from the image signal receiver 52 to the external apparatus such as a personal computer, and the original-document reading operation ends. At this time, the battery-storage connector 15 and the battery-charging connector 16 are also connected to each other again by the electrode portions 15a and 16a, so that the battery 15 charges again, and the frame member 3 is positioned on standby in the initial position.

As described above, by using the image reading apparatus according to the second embodiment, the driving signals required for the operation of the image device 32, and the digital image signal can be transmitted without using any cable. Thus, this can greatly suppress the generation of emission. In addition, since any cable is not used at all, warping of cable caused by the sliding operation of the frame member 3 can be prevented, and the thickness of the image reading apparatus can be easily reduced.

Figure 8:
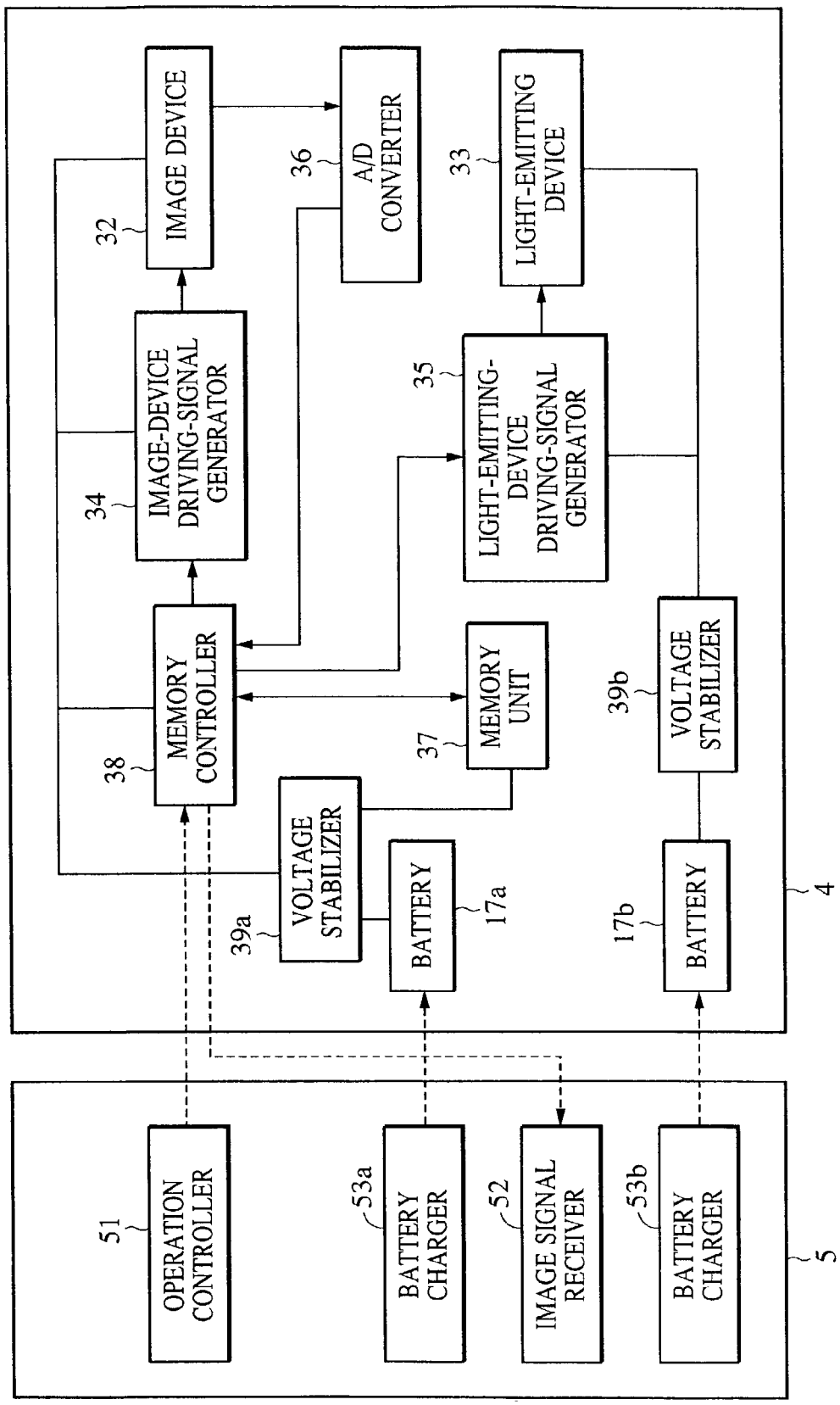
FIG. 8 is a block diagram showing a modification of the second embodiment of the present invention.

Although the battery 15 totally supplies power to the image-capturing printed circuit board 4, the second embodiment is not limited thereto. As FIG. 8 shows, the image reading apparatus may be designed so that, by providing the image-capturing printed circuit board 4 with two batteries 17a and 17b, power is supplied from the battery 17a to the image device 32, the image-device driving-signal generator 34, and the memory controller 38 via a voltage stabilizer 39a, and power is supplied from the battery 17b to the light-emitting device 33 and the light-emitting-device driving-signal generator 35 via a voltage stabilizer 39b. In this case, it is required that the controlling printed circuit board 5 include two battery chargers 53a and 53b respectively connected to the batteries 17a and 17b.

Third Embodiment

Figure 9:
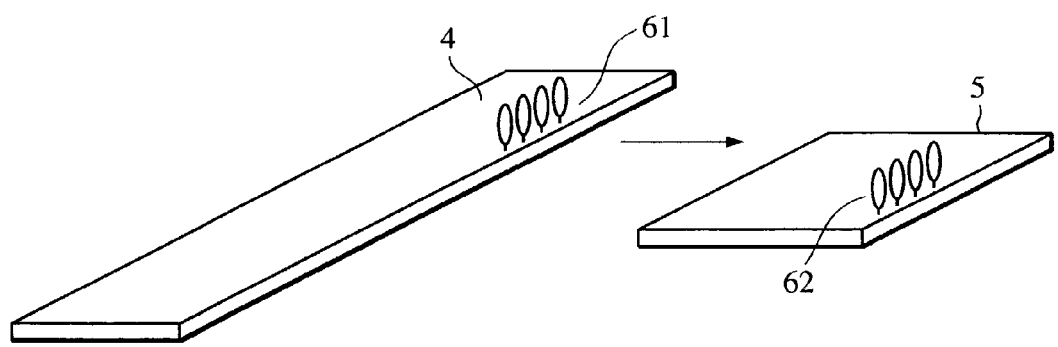
FIG. 9 is a perspective illustration of an image reading apparatus according to a third embodiment of the present invention.
Figure 10:
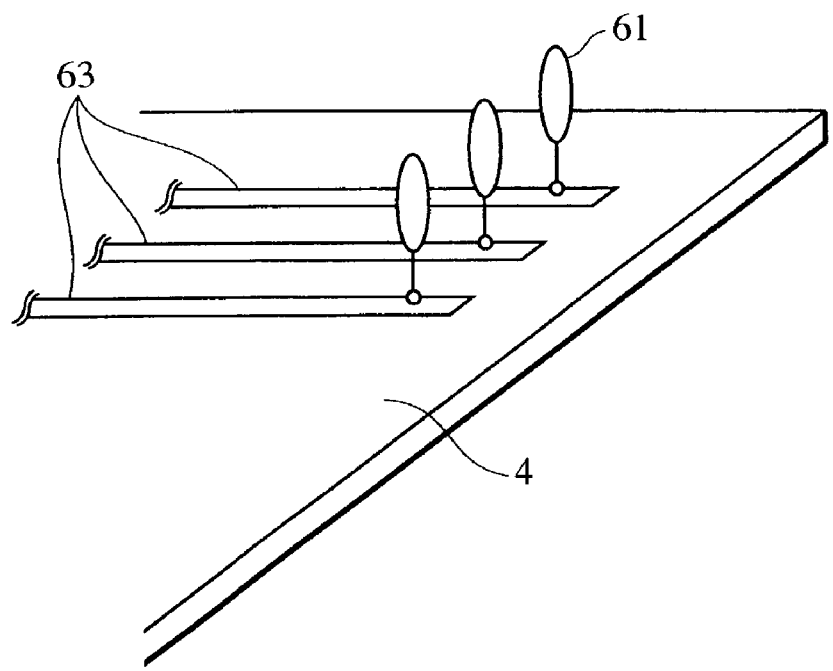
FIG. 10 is a perspective view showing the main part of the image reading apparatus according to the third embodiment of the present invention.
Figure 11:
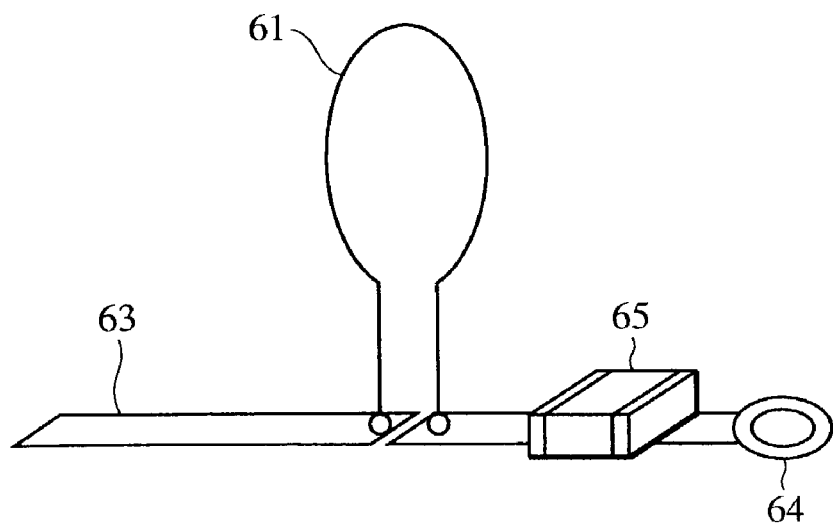
FIG. 11 is a detailed illustration of the image reading apparatus according to the third embodiment of the present invention.

FIGS. 9, 10, and 11 show a third embodiment of the present invention, and show an electric connection part between the image-capturing printed circuit board 4, which includes the image device 32, and the controlling printed circuit board 5 for controlling the reading operation. In FIGS. 9, 10, and 11, members identical to those in the first embodiment are denoted by identical reference numerals.

For signal transmission and reception between the image-capturing printed circuit board 4 and the controlling printed circuit board 5 in the third embodiment, not the contact connectors in the first embodiment but a non-contact means is used. As FIG. 9 shows, the image-capturing printed circuit board 4 includes a plurality of transmitting/receiving antenna portions 61, and the controlling printed circuit board 5 includes a plurality of transmitting/receiving antenna portions 62. The pluralities of transmitting/receiving antenna portions 61 and 62 are used for transmitting and receiving electric signals.

FIG. 10 is an enlarged view of the neighborhood of the transmitting/receiving antenna portions 61 of the image-capturing printed circuit board 4. FIG. 11 is a further enlarged view of the transmitting/receiving antenna portions 61 shown in FIG. 10. The transmitting/receiving antenna portions 61 are formed so that their loop-antenna structures connect slit-shaped discontinuous portions of image-signal lines 63 extending from the memory unit 37. One end of each image-signal line is terminated by a terminator 65 and a grounded throughhole 64. Also the transmitting/receiving antenna portions 62 of the controlling printed circuit board 5 are similar in structure.

In the initial position in the reading operation, the pluralities of transmitting/receiving antenna portions 61 and 62 are disposed in noncontact condition, with a predetermined distance provided therebetween. Before the driving of the image device 32 is started, control signals are transmitted from the transmitting/receiving antenna portions 62 of the controlling printed circuit board 5 to the transmitting/receiving antenna portions 62 of the image-capturing printed circuit board 4. After the driving of the image device 32 ends and it returns to the initial position, read image signals are transmitted from the transmitting/receiving antenna portions 61 of the image-capturing printed circuit board 4 to the transmitting/receiving antenna portions 62 of the controlling printed circuit board 5.

By employing the above-described construction, in addition to the advantage by the above-described first embodiment, signal transmission and reception between the image-capturing printed circuit board 4 and the controlling printed circuit board 5 can be performed in noncontact condition. Thus, this can prevent problems such as deterioration of electrode portion caused by mechanical contact.

Fourth Embodiment

Figure 12:
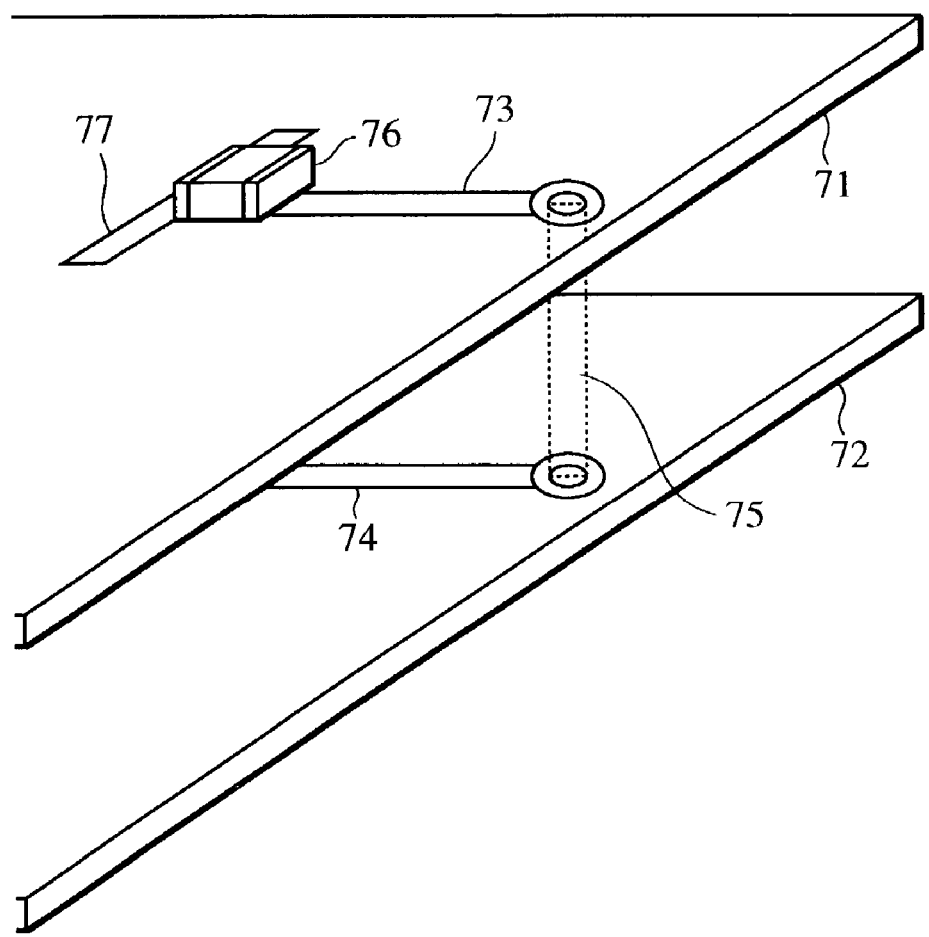
FIG. 12 is a perspective view showing an image reading apparatus according to a fourth embodiment of the present invention.

FIG. 12 shows a fourth embodiment of the present invention, and shows an electric connection part between the image-capturing printed circuit board 4, which includes the image device 32, and the controlling printed circuit board 5 for controlling the reading operation. In FIG. 12, members identical to those in the first embodiment are denoted by identical reference numerals.

Similarly to the third embodiment, for signal transmission and reception between the image-capturing printed circuit board 4 and the controlling printed circuit board 5, a noncontact means is used.

As FIG. 12 shows, the image-capturing printed circuit board 4 is divided into two layers, that is, a first wiring layer 71 and a second wiring layer 72. On the first wiring layer 71, an image-signal line 73 is formed, on the second wiring layer 72, an image-signal line 74 is formed. The image-signal lines 73 and 74 are connected by a throughhole 75, so that the image-signal lines 73 and 74, and the throughhole 75 constitute a transmitting/receiving loop-antenna portion. In this case, after the loop is formed, one end of the loop is connected to a ground line 77 via a terminator 76.

The controlling printed circuit board 5 is also divided into two layers, that is, a first wiring layer and a second wiring layer. An image-signal line in the first wiring layer, and an image-signal line in the second wiring layer, and a throughhole constitute a transmitting/receiving loop-antenna portion.

In the initial position in the reading operation, transmitting/receiving loop-antenna portions constituted by the image-signal lines and throughholes of the image-capturing printed circuit board 4 and the controlling printed circuit board 5 are disposed in noncontact condition, with a predetermined distance provided therebetween. Before the driving of the image device 32 is started, a control signal is transmitted from the transmitting/receiving loop-antenna portion of the controlling printed circuit board 5 to the transmitting/receiving loop-antenna portion of the image-capturing printed circuit board 4. After the driving of the image device 32 ends and it returns to the initial position, a read image signal is transmitted from the transmitting/receiving loop-antenna portion of the image-capturing printed circuit board 4 to the transmitting/receiving loop-antenna portion of the controlling printed circuit board 5.

By employing a transmitting/receiving antenna portion as described above, an antenna portion that suppresses emission at reduced cost can be formed in addition to the advantage by the third embodiment.

In the present invention, the shape of a formed antenna portion is not limited to a loop, but may be any shape if it can generate an electromagnetic field.

In the present invention, a position for signal transmission and reception between the image-capturing printed circuit board 4 and the controlling printed circuit board 5 is described using the initial position in the reading operation. However, by dividing the transmitting and receiving functions of the controlling printed circuit board 5 into two circuit boards, the signal transmission and reception between the image-capturing printed circuit board 4 and the controlling printed circuit board 5 can be performed also in two positions at the opposite ends of the movable range of the frame member 3.

As described above, according to the present invention, in the structure of an image reading apparatus including an image device, by providing a memory unit on a printed circuit board including the image device, and by transmitting/receiving an electric signal to/from a controlling printed circuit board only in a specified initial position, the need for transmission and reception of driving and image signals by using conventionally used cable wires is eliminated. Thus, it is possible to suppress emission which is caused by a driving signal for the image device and a read image signal, and which is from a signal-transmitting cable.

Also, by providing an image-capturing printed circuit board with a battery, providing a controlling printed circuit board with a battery charger, and using the battery to supply each electric circuit with power, the need for power supply using conventional cable wires is eliminated. Thus, emission from the power-supply cable wire can be suppressed.

In addition, for signal transmission and reception between an image-capturing printed circuit board and a controlling printed circuit board, by proving both circuit boards with antenna portions, and using electromagnetic waves to perform the transmission and reception, problems such as deterioration in a contact portion which is caused by mechanical contact can be avoided.

Moreover, by using lines of a circuit board to realize an antenna portion, an antenna portion that suppresses emission at reduced cost can be formed.

While the present invention has been described with reference to what are presently considered to be the preferred embodiments, it is to be understood that the invention is not limited to the disclosed embodiments. On the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. An image reading apparatus for reading an original document set in position, said image reading apparatus comprising:
    an image-capturing printed circuit board with which an image device is integrated, said image-capturing printed circuit board being movable, driving said image device, and including a first connector; and
    a controlling printed circuit board disposed in a fixed position, said controlling printed circuit board controlling the operation of said image device, and including a second connector;
    wherein said first connector and said second connector are electrically connected to each other only in a predetermined position so that signal transmission and reception is performed between said first connector and said second connector.

2. An image reading apparatus according to claim 1, wherein said image-capturing printed circuit board includes at least:
    said image device;
    a driving-signal generating circuit for driving said image device;
    a converting circuit for converting an electric signal corresponding to image information read by said image device into a digital signal; and
    a memory unit for storing the digital signal and a driving signal for said image device.

3. An image reading apparatus according to claim 2, wherein said image-capturing printed circuit board includes a memory controller for controlling the data stored in said memory unit.

4. An image reading apparatus according to claim 1, wherein a light-emitting device is integrated with said image-capturing printed circuit board, and said controlling printed circuit board also controls the operation of said light-emitting device.

5. An image reading apparatus according to claim 4, said image-capturing printed circuit board includes at least:
    said image device;
    an image-device driving-signal generating circuit for driving said image device;
    a converting circuit for converting image information read by said image device into a digital signal;
    a light-emitting device;
    a light-emitting-device driving-signal generating circuit for driving said light-emitting device; and
    a memory unit for storing a driving signal for said image device, a driving signal for said light-emitting device, and the digital signal.

6. An image reading apparatus according to claim 5, wherein said image-capturing printed circuit board includes a memory controller for controlling the data stored in said memory unit.

7. An image reading apparatus according to claim 1, wherein:
    said image-capturing printed circuit board includes at least one battery means, the battery means including a battery connector;
    said controlling printed circuit board includes at least one charging means, the charging means including a charging connector; and
    electric power is supplied from the charging means to the battery means when said capacitor conencter and the charging connector are electrically connected to each other in said predetermined position.

8. An image reading apparatus according to claim 7, wherein said image-capturing printed circuit board includes at least:
    said image device;
    a driving-signal generating circuit for driving said image device;
    a converting circuit for converting an electric signal corresponding to image information read by said image device into a digital signal;
    a memory unit for storing the digital signal and a driving signal for said image device;
    a battery means for storing electric power; and
    a voltage stabilizing circuit for converting the stored power into a constant voltage.

9. An image reading apparatus according to claim 1, wherein said predetermined position is an initial position in which said image-capturing printed circuit board is positioned on standby.

10. An image reading apparatus for reading an original document set in position, said image reading apparatus comprising:
    an image-capturing printed circuit board with which an image device is integrated, said image-capturing printed circuit board being movable, driving said image device, and including a first connector; and
    a controlling printed circuit board for controlling the operation of said image device, said controlling printed circuit board including a second connector;
    wherein said first connector and said second connector are antenna portions which perform signal transmission and reception when being in proximity to each other so as to have a predetermined distance therebetween.

11. An image reading apparatus according to claim 10, wherein said antenna portions are formed by the wiring patterns of both printed circuit boards.

12. An image reading apparatus comprising:
    a first printed circuit board with which an image device and a first connector are integrated, said first printed circuit board being movable, and driving said image device; and
    a second printed circuit board, with which a second connector is integrated, disposed in a fixed position, said second printed circuit board controlling the operation of said image device;
    wherein said first connector and said second connector are electrically connected to each other in a predetermined position so that signal transmission is performed between said first connector and said second connector.

* * * * *

UNITED STATES PATENT AND TRADEMARK OFFICE
CERTIFICATE OF CORRECTION

PATENT NO. : 7,119,933 B2
APPLICATION NO. : 10/194280
DATED : October 10, 2006
INVENTOR(S) : Satoshi Sugimoto It is certified that error appears in the above-identified patent and that said Letters Patent is hereby corrected as shown below:

COLUMN 7

Line 21, "synchronization" should read --synchronization with--.

COLUMN 13

Line 3, "proving" should read --providing--; and
Line 58, "said" should read --wherein said--.

Signed and Sealed this

Twenty-sixth Day of June, 2007

JON W. DUDAS
*Director of the United States Patent and Trademark Office*